(12) United States Patent
Wang et al.

(10) Patent No.: US 10,354,891 B2
(45) Date of Patent: Jul. 16, 2019

(54) ELECTRONIC PACKAGE AND METHOD FOR FABRICATING THE SAME

(71) Applicant: Siliconware Precision Industries Co., Ltd., Taichung (TW)

(72) Inventors: Po-Hao Wang, Taichung (TW); Chih-Jen Yang, Taichung (TW); Yu-Chih Cheng, Taichung (TW); Chee-Key Chung, Taichung (TW); Chang-Fu Lin, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 15/945,308

(22) Filed: Apr. 4, 2018

(65) Prior Publication Data

US 2019/0181021 A1 Jun. 13, 2019

(30) Foreign Application Priority Data

Dec. 8, 2017 (TW) .............................. 106143154 A

(51) Int. Cl.
| | |
|---|---|
| *H01L 23/52* | (2006.01) |
| *H01L 21/56* | (2006.01) |
| *H01L 23/31* | (2006.01) |
| *H01L 23/498* | (2006.01) |
| *H01L 23/00* | (2006.01) |

(52) U.S. Cl.
CPC ........ *H01L 21/568* (2013.01); *H01L 23/3128* (2013.01); *H01L 23/49838* (2013.01); *H01L 24/06* (2013.01); *H01L 2224/04105* (2013.01); *H01L 2924/14* (2013.01); *H01L 2924/15311* (2013.01); *H01L 2924/181* (2013.01)

(58) Field of Classification Search
CPC .............. H01L 21/568; H01L 23/3128; H01L 23/49838; H01L 24/06
USPC ........................................................ 257/737
See application file for complete search history.

(56) References Cited

U.S. PATENT DOCUMENTS

| | | | | |
|---|---|---|---|---|
| 6,794,273 B2* | 9/2004 | Saito | .................... | H01L 21/4857 257/618 |
| 8,604,615 B2* | 12/2013 | Lee | ..................... | H01L 23/3135 257/685 |
| 8,637,997 B2* | 1/2014 | Onodera | ................ | H01L 21/563 257/666 |
| 8,963,336 B2* | 2/2015 | Jung | ....................... | H01L 24/96 257/774 |
| 9,184,139 B2* | 11/2015 | Choi | ........................ | H01L 24/97 |
| 9,620,430 B2* | 4/2017 | Lu | ........................ | H01L 23/3135 |

* cited by examiner

*Primary Examiner* — Luan C Thai
(74) *Attorney, Agent, or Firm* — Mintz Levin Cohn Ferris Glovsky and Popeo, P.C.; Peter F. Corless; Steven M. Jensen

(57) ABSTRACT

An electronic package and a method for fabricating the same are provided. The method includes forming a filling material, such as an underfill, between a carrier and a plurality of electronic components and filling the filling material in a space between the electronic components to form a spacing portion. The spacing portion has a first segment and a second segment separated from each other to serve as a stress buffer zone. Therefore, when an encapsulation layer encapsulating the electronic components is subsequently ground, the present disclosure can effectively prevent the electronic components from being cracked due to stresses induced by the external grinding force.

18 Claims, 4 Drawing Sheets

US 10,354,891 B2

ELECTRONIC PACKAGE AND METHOD FOR FABRICATING THE SAME

CROSS-REFERENCE TO RELATED APPLICATION

This Application claims priority under 35 U.S.C. § 119(a) the benefit of Taiwanese Patent Application No. 106143154 filed on Dec. 8, 2017, the entire contents of which are incorporated herein by reference.

BACKGROUND

1. Technical Field

The present disclosure relates to semiconductor devices, and, more particularly, to an electronic package and a method for fabricating the same.

2. Description of Related Art

Along with the rapid development of electronic industries, electronic products are developed toward the trend of multi-function and high performance. Accordingly, various types of flip-chip packaging modules, such as chip scale packages (CSPs), direct chip attached (DCA) packages and multi-chip modules (MCM) and 3D IC chip stacking technologies, have been developed.

FIG. 1 is a schematic cross-sectional view of a conventional 3D IC-type semiconductor package 1. Referring to FIG. 1, a silicon interposer 10 is provided. The silicon interposer 10 has a first side 10a, an opposite second side 10b having a circuit structure 101, and a plurality of through silicon vias (TSVs) 100 communicating the first side 10a and the second side 10b. A plurality of semiconductor elements 11 are disposed on the circuit structure 101 of the second side 10b through a plurality of solder bumps 12, and a filling material 13, such as an underfill, is formed to encapsulate the solder bumps 12. Then, an encapsulation layer 14 is formed to encapsulate the semiconductor elements 11. Further, the encapsulation layer 14 is ground to expose upper surfaces of the semiconductor elements 11. Subsequently, the first side 10a of the silicon interposer 10 is disposed on a packaging substrate 16 through a plurality of conductive elements 15 and the TSVs 100 are electrically connected to the packaging substrate 16. Then, an underfill 17 is formed to encapsulate the conductive elements 15. Thereafter, an encapsulant 18 is formed to encapsulate the encapsulation layer 14 and the silicon interposer 10. Finally, a plurality of solder balls 160 are disposed on a lower side of the packaging substrate 16 so as for the packaging substrate 16 to be mounted on a circuit board 19.

However, during the packaging process, the filling material 13 will be formed in a space S between the semiconductor elements 11 due to a capillary effect, thus increasing internal stresses of the semiconductor elements 11. As such, when the encapsulation layer 14 is ground, external grinding forces will be transferred into the semiconductor elements 11, causing stress concentration and cracking of the semiconductor elements 11 and hence reducing the product reliability.

Therefore, how to overcome the above-described drawbacks has become critical.

SUMMARY

In view of the above-described drawbacks, the present disclosure provides an electronic package, which comprises: a carrier; a first electronic component and a second electronic component disposed on the carrier and separated from each other by a space; a filling material formed between the first electronic component and the carrier and between the second electronic component and the carrier and filled in the space to form a spacing portion, wherein the spacing portion has a first segment adjacent to the first electronic component and a second segment adjacent to the second electronic component and separated from the first segment; and an encapsulation layer formed on the carrier and encapsulating the first electronic component and the second electronic component, wherein upper surfaces of the first electronic component and the second electronic component are exposed from the encapsulation layer.

The present disclosure further provides a method for fabricating an electronic package, which comprises: disposing a first electronic component and a second electronic component on a carrier, wherein the first electronic component and the second electronic component are separated from each other by a space; forming a filling material between the first electronic component and the carrier and between the second electronic component and the carrier and filling the filling material in the space to form a spacing portion, wherein the spacing portion has a first segment adjacent to the first electronic component and a second segment adjacent to the second electronic component and separated from the first segment; and forming an encapsulation layer on the carrier to encapsulate the first electronic component and the second electronic component, wherein upper surfaces of the first electronic component and the second electronic component are exposed from the encapsulation layer.

In an embodiment, the carrier can be electrically connected to the first electronic component and the second electronic component.

In an embodiment, the first electronic component and the second electronic component can be of the same or different types.

In an embodiment, the first electronic component can comprise an encapsulation material, a control chip bonded to the encapsulation material, and a high bandwidth memory (HBM) chip. In another embodiment, the encapsulation layer and the encapsulation material are made of different materials.

In an embodiment, the second electronic component can be an application-specific integrated circuit (ASIC) semiconductor chip.

In an embodiment, the first segment can differ in thickness from the second segment.

In an embodiment, at least one of the first segment and the second segment can have a thickness greater than or equal to 30 μm.

In an embodiment, the encapsulation layer can be partially removed to form an upper surface that is flush with the upper surfaces of the first electronic component and the second electronic component.

In an embodiment, the encapsulation layer can further be formed in the space and between the first segment and the second segment.

According to the present disclosure, since the filling material is formed in the space between the first electronic component and the second electronic component and has the first segment and the second segment separated from each other, the region between the first segment and the second segment can serve as a stress buffer zone. As such, during partial removal of the encapsulation layer, the present disclosure can effectively prevent the first electronic component and the second electronic component from being cracked duo to stress concentration.

BRIEF DESCRIPTION OF DRAWINGS

FIG. 2C-1 is a schematic partial enlarged view of FIG. 2C; and

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2D are schematic cross-sectional views showing a method for fabricating an electronic package 2 according to the present disclosure.

Figure 2A:
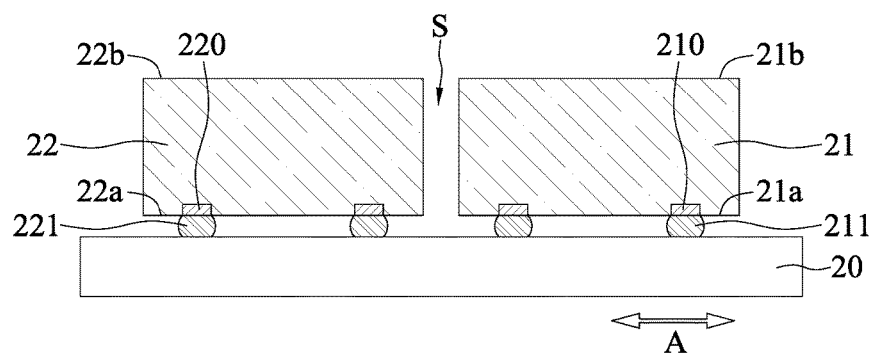
FIGS. 2A to 2D are schematic cross-sectional views showing a method for fabricating an electronic package according to the present disclosure.

Referring to FIG. 2A, at least one first electronic component 21 and at least one second electronic component 22 are disposed on a carrier 20 in a horizontal direction A and a space S is formed between the first electronic component 21 and the second electronic component 22.

In an embodiment, the carrier 20 is a semiconductor substrate having a plurality of TSVs and serving as a silicon interposer. In another embodiment, the carrier 20 is a packaging substrate having a core layer and a circuit structure, or a coreless circuit structure, for example, a redistribution layer (RDL). In yet another embodiment, the carrier 20 can be a carrying unit for carrying an electronic component, such as a semiconductor chip. In still another embodiment, the carrier 20 is a lead frame.

The first electronic component 21 is an active component, such as a semiconductor chip, a passive component, such as a resistor, a capacitor or an inductor, a package structure, or a combination thereof. For example, the first electronic component 21 is a semiconductor chip having an active surface 21a with a plurality of electrode pads 210 and an inactive surface 21b opposite to the active surface 21a. A plurality of conductive bumps 211 are disposed on the electrode pads 210 for bonding and electrically connecting the first electronic component 21 to the carrier 20.

The second electronic component 22 is an active component, such as a semiconductor chip, a passive component, such as a resistor, a capacitor or an inductor, a package structure, or a combination thereof. For example, the second electronic component 22 is a semiconductor chip having an active surface 22a with a plurality of electrode pads 220 and an inactive surface 22b opposite to the active surface 22a. A plurality of conductive bumps 221 are disposed on the electrode pads 220 for bonding and electrically connecting the second electronic component 22 to the carrier 20.

In an embodiment, the first electronic component 21 and the second electronic component 22 are of the same type (i.e., active elements) and have the same or different internal structures.

Figure 3:
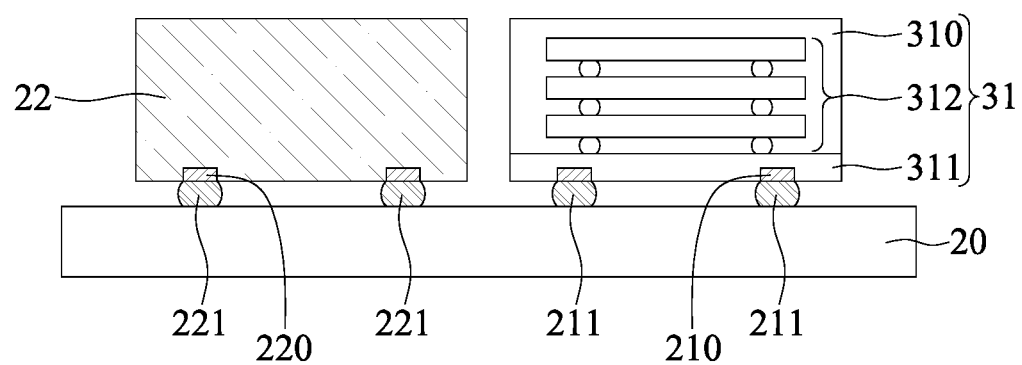
FIG. 3 is a schematic cross-sectional view showing another embodiment of FIG. 2A.

In another embodiment, the first electronic component 21 and the second electronic component 22 can be of different types. Referring to FIG. 3, the first electronic component 31 is a package structure and the second electronic component 22 is an active component. In an embodiment, the first electronic component 31 is a packaging module having an encapsulation material 310, a control chip 311 and at least one HBM (high bandwidth memory) chip 312, and the second electronic component 22 is an ASIC (application-specific integrated circuit) semiconductor chip.

Figure 2B:
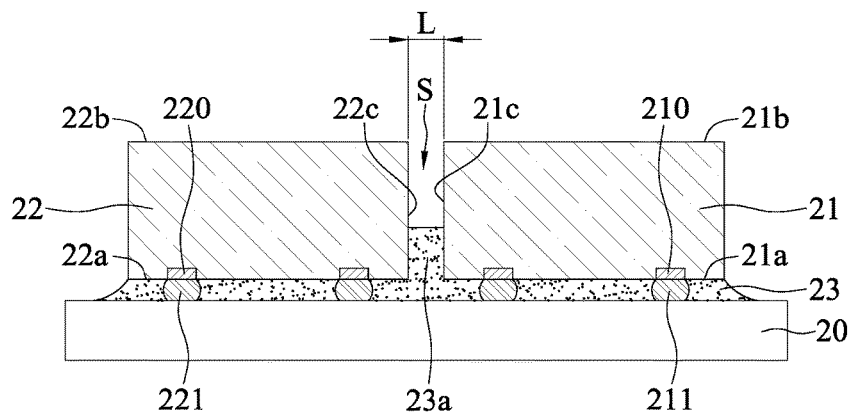

Referring to FIG. 2B, a filling material 23 is formed between the first electronic component 21 and the carrier 20 and between the second electronic component 22 and the carrier 20 to encapsulate the conductive bumps 211, 221.

In an embodiment, the filling material 23 is, for example, an underfill, which is formed in the space S between the first electronic component 21 and the second electronic component 22. In another embodiment, the filling material 23 extends to a side surface 21c of the first electronic component 21 and a side surface 22c of the second electronic component 22 due to a capillary effect, thus forming a spacing portion 23a of the filling material 23 between the first electronic component 21 and the second electronic component 22. The spacing portion 23a has a block shape. The space S has a width L (i.e., the distance between the first electronic component 21 and the second electronic component 22) less than or equal to 150 μm. The less the width L of the space S is, the stronger the capillary effect of the filling material 23 in the space S becomes.

Figure 1:
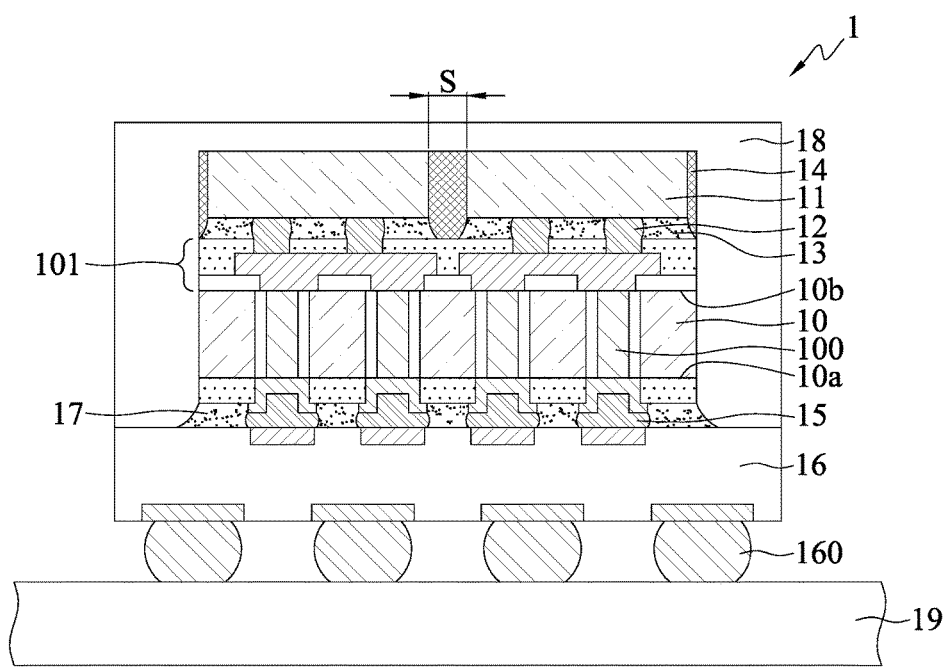
FIG. 1 is a schematic cross-sectional view of a conventional semiconductor package.
Figure 2C:
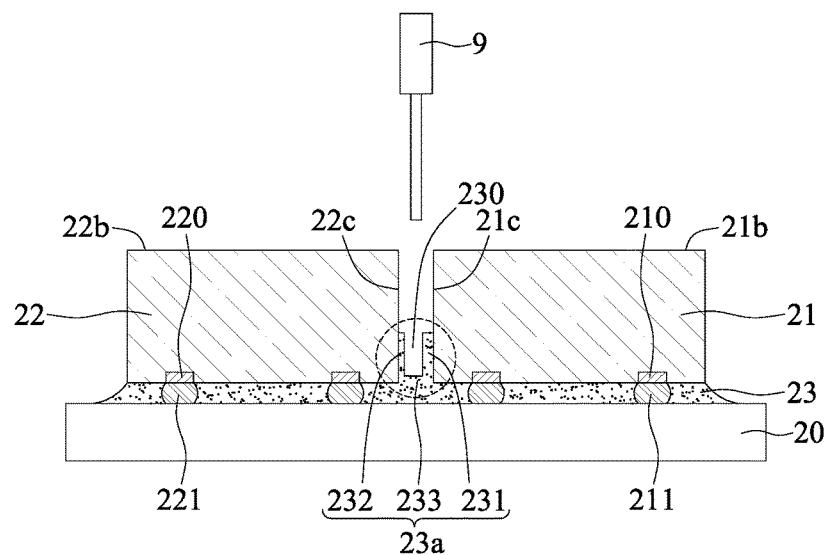
Figures 1, 2C:
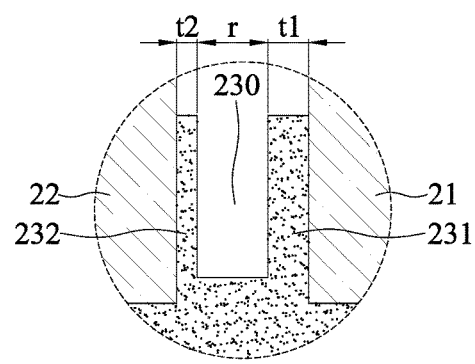

Referring to FIGS. 2C and 2C-1, at least one recess 230 is formed in the spacing portion 23a. As such, the spacing portion 23a has a bottom portion 233, and a first segment 231 and a second segment 232 positioned on the bottom portion 233 and separated from each other. The first segment 231 is bonded to the side surface 21c of the first electronic component 21 and the second segment 232 is bonded to the side surface 22c of the second electronic component 22.

In an embodiment, to form the recess 230, the filling material 23 is partially removed by cutting, laser ablation or etching, for example. A cutting tool 9 having a cutting width of about 110 μm may be used for generating a width r of at least 110 μm for the recess 230.

In an embodiment, the thickness t1 of the first segment 231 is different from (for example, greater than) the thickness t2 of the second segment 232, and the thickness t1 of the first segment 231 is at least 30 μm. In another embodiment, if the thickness of at least one of the first segment 231 and the second segment 232 is too small, for example, less than 30 μm, an encapsulation layer 24 formed in a subsequent process will contract and pull at the filling material 23, thus causing delamination of the filling material 23 from the electronic component. Therefore, the thickness of at least one of the first segment 231 and the second segment 232 is greater than or equal to 30 μm.

Figure 2D:
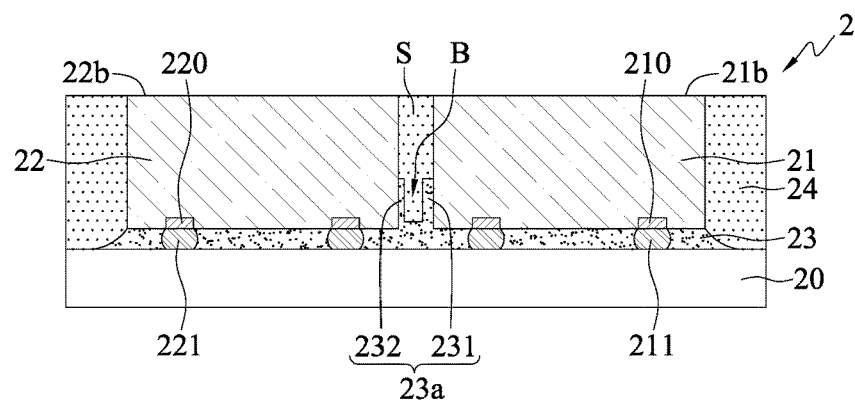

Referring to FIG. 2D, an encapsulation layer 24 is formed on the carrier 20 to encapsulate the filling material 23, the first electronic component 21 and the second electronic component 22. The inactive surface 21b of the first electronic component 21 and the inactive surface 22b of the second electronic component 22 are exposed from the encapsulation layer 24.

In an embodiment, the encapsulation layer 24 is formed on the carrier 20 by lamination or molding. In another embodiment, the encapsulation layer 24 is filled in the space S and the recess 230.

Further, by performing a leveling process or a thinning process, an upper surface of the encapsulation layer 24 is coplanar with the inactive surface 21b of the first electronic component 21 and the inactive surface 22b of the second electronic component 22. In an embodiment, the encapsulation layer 24 is first formed on the carrier 20 to cover the inactive surface 21b of the first electronic component 21 and the inactive surface 22b of the second electronic component 22. Then, the encapsulation layer 24 is partially removed by grinding or cutting (if needed, both the first electronic component 21 and the second electronic component 22 can be partially removed from the inactive surfaces 21b, 22b thereof) to form an upper surface that is flush with the inactive surface 21b of the first electronic component 21 and the inactive surface 22b of the second electronic component 22.

The encapsulation layer 24 is made of an insulating material, such as polyimide, a dry film, an epoxy resin, a molding compound, a photoresist material, or a solder mask.

In an embodiment, referring to FIG. 3, the encapsulation material 310 of the first electronic component 31 is made of, for example, polyimide, a dry film, an epoxy resin, a molding compound, a photoresist material, or a solder mask. The encapsulation material 310 and the encapsulation layer 24 can be made of the same or different materials.

According to the present disclosure, the filling material 23 in the space S has the first segment 231 and the second segment 232 separated from each other. Therefore, the region between the first segment 231 and the second segment 232 (i.e., the recess 230) can serve as a stress buffer zone B to reduce internal stresses of the first electronic component 21 and the second electronic component 22 induced by the filling material 23. As such, during partial removal of the encapsulation layer 24, even if an external grinding or cutting force is transferred to the first electronic component 21 and the second electronic component 22, stresses imposed on the first electronic component 21 and the second electronic component 22 can be dispersed so as to prevent the first electronic component 21 and the second electronic component 22 from being cracked duo to stress concentration.

Referring to FIG. 3, if the encapsulation material 310 and the encapsulation layer 24 are made of different materials, stresses can be induced by contraction in the fabrication process and cause delamination between the first electronic component 21 and the filling material 23. Therefore, the present disclosure controls the thickness t1 of the first segment 231 (for example, greater than or equal to 30 µm) so as to enable the first segment 231 to withstand stresses, thus preventing delamination from occurring between the first electronic component 21 and the first segment 231.

The present disclosure further provides an electronic package 2, which has: a carrier 20; a first electronic component 21, 31 and a second electronic component 22 disposed on and electrically connected to the carrier 20 through a plurality of conductive bumps 211 221, wherein a space S is formed between the first electronic component 21, 31 and the second electronic component 22; a filling material 23 formed between the first electronic component 21, 31 and the carrier 20 and between the second electronic component 22 and the carrier 20 and filled in the space S between the first electronic component 21, 31 and the second electronic component 22 to form a spacing portion 23, wherein the spacing portion 23 has a first segment 231 adjacent to the first electronic component 21, 31 and a second segment 232 adjacent to the second electronic component 22 and separated from the first segment 231; and an encapsulation layer 24 formed on the carrier 20 to encapsulate the first electronic component 21, 31 and the second electronic component 22, wherein upper surfaces of the first electronic component 21, 31 and the second electronic component 22 are exposed from the encapsulation layer 24.

In an embodiment, the first electronic component 21 and the second electronic component 22 are of the same type.

In an embodiment, the first electronic component 21 and the second electronic component 22 are of different types. In another embodiment, the first electronic component 31 has an encapsulation material 310, and a control chip 311 bonded to the encapsulation material 310, and an HBM chip 312. In yet another embodiment, the second electronic component 22 is an ASIC semiconductor chip.

In an embodiment, the thickness (width) t1 of the first segment 231 is different from the thickness (width) t2 of the second segment 232.

In an embodiment, the thickness of at least one of the first segment 231 and the second segment 232 is greater than or equal to 30 µm.

In an embodiment, the upper surfaces of the first electronic component 21, 31 and the second electronic component 22 are flush with an upper surface of the encapsulation layer 24.

In an embodiment, the encapsulation layer 24 is further formed in the space S and between the first segment 231 and the second segment 232.

According to the present disclosure, since the filling material is formed in the space between the first electronic component and the second electronic component and has the first segment and the second segment separated from one another, the region between the first segment and the second segment can serve as a stress buffer zone to reduce internal stresses of the first electronic component and the second electronic component induced by the filling material. As such, during partial removal of the encapsulation layer, the present disclosure can effectively prevent the first electronic component and the second electronic component from being cracked, thereby improving the product reliability.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
   a carrier;
   a first electronic component and a second electronic component disposed on the carrier and separated from each other by a space;
   a filling material formed between the first electronic component and the carrier and between the second electronic component and the carrier, and filled in the space to form a spacing portion, wherein the spacing portion has a bottom portion, a first segment positioned on the bottom portion and adjacent to the first electronic component, and a second segment positioned on the bottom portion, adjacent to the second electronic component and separated from the first segment, and wherein the first segment differs in thickness from the second segment; and an encapsulation layer formed on the carrier and encapsulating the first electronic component and the second electronic component, wherein the first electronic component and the second electronic component have upper surfaces exposed from the encapsulation layer.

2. The electronic package of claim 1, wherein the carrier is electrically connected to the first electronic component and the second electronic component.

3. The electronic package of claim 1, wherein the first electronic component and the second electronic component are of the same or different types.

4. The electronic package of claim 1, wherein the first electronic component comprises an encapsulation material, a control chip bonded to the encapsulation material, and a high bandwidth memory chip.

5. The electronic package of claim 4, wherein the encapsulation layer and the encapsulation material are made of different materials.

6. The electronic package of claim 1, wherein the second electronic component is an application-specific integrated circuit semiconductor chip.

7. The electronic package of claim 1, wherein at least one of the first segment and the second segment has a thickness greater than or equal to 30 µm.

8. The electronic package of claim 1, wherein the upper surfaces of the first electronic component and the second electronic component are flush with an upper surface of the encapsulation layer.

9. The electronic package of claim 1, wherein the encapsulation layer is further formed in the space and between the first segment and the second segment.

10. A method for fabricating an electronic package, comprising:
　　disposing a first electronic component and a second electronic component on a carrier, wherein the first electronic component and the second electronic component are separated from each other by a space;
　　forming a filling material between the first electronic component and the carrier and between the second electronic component and the carrier, and filling the filling material in the space to form a spacing portion, wherein the spacing portion has a bottom portion, a first segment positioned on the bottom portion and adjacent to the first electronic component, and a second segment positioned on the bottom portion, adjacent to the second electronic component and separated from the first segment, and wherein the first segment differs in thickness from the second segment; and
　　forming an encapsulation layer on the carrier to encapsulate the first electronic component and the second electronic component, wherein the first electronic component and the second electronic component have upper surfaces exposed from the encapsulation layer.

11. The method of claim 10, wherein the carrier is electrically connected to the first electronic component and the second electronic component.

12. The method of claim 10, wherein the first electronic component and the second electronic component are of the same or different types.

13. The method of claim 10, wherein the first electronic component comprises an encapsulation material, a control chip bonded to the encapsulation material, and a high bandwidth memory chip.

14. The method of claim 13, wherein the encapsulation layer and the encapsulation material are made of different materials.

15. The method of claim 10, wherein the second electronic component is an application-specific integrated circuit semiconductor chip.

16. The method of claim 10, wherein at least one of the first segment and the second segment has a thickness greater than or equal to 30 µm.

17. The method of claim 10, further comprising removing a portion of the encapsulation layer such that the encapsulation layer has an upper surface flush with the upper surfaces of the first electronic component and the second electronic component.

18. The method of claim 10, further comprising forming the encapsulation layer in the space and between the first segment and the second segment.

* * * * *